United States Patent
Yamada

(10) Patent No.: US 7,919,852 B2
(45) Date of Patent: Apr. 5, 2011

(54) SEMICONDUCTOR DEVICE AND INSULATING SUBSTRATE UTILIZING A SECOND CONDUCTOR WITH A NON-JOINT AREA

(75) Inventor: Junji Yamada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 394 days.

(21) Appl. No.: 11/332,539

(22) Filed: Jan. 17, 2006

(65) Prior Publication Data

US 2006/0220235 A1 Oct. 5, 2006

(30) Foreign Application Priority Data

Mar. 16, 2005 (JP) ................... 2005-074805

(51) Int. Cl.
*H01L 23/34* (2006.01)
*H01L 21/00* (2006.01)
*H05K 7/20* (2006.01)

(52) U.S. Cl. ........ 257/706; 257/712; 257/717; 257/720; 257/E23.051; 438/122; 361/709

(58) Field of Classification Search .................. None
See application file for complete search history.

(56) References Cited

U.S. PATENT DOCUMENTS

| | | | | |
|---|---|---|---|---|
| 4,989,117 A | * | 1/1991 | Hernandez | 361/306.2 |
| 6,791,180 B2 | * | 9/2004 | Kitamura et al. | 257/701 |
| 6,844,621 B2 | | 1/2005 | Morozumi et al. | |
| 6,984,883 B2 | | 1/2006 | Yamada et al. | |
| 2002/0060091 A1 | * | 5/2002 | Naba et al. | 174/257 |
| 2004/0188828 A1 | * | 9/2004 | Nagatomo et al. | 257/703 |
| 2005/0094381 A1 | * | 5/2005 | Imamura et al. | 361/750 |

FOREIGN PATENT DOCUMENTS

| | | | |
|---|---|---|---|
| EP | 0 789 397 A2 | | 8/1997 |
| JP | 8-83864 | | 3/1996 |
| JP | 11-265976 | | 9/1999 |
| JP | 2000-101203 | | 4/2000 |
| JP | 2000-349209 | | 12/2000 |
| JP | 2002-373955 | | 12/2002 |
| JP | 2004228286 A | * | 8/2004 |
| JP | 2006-240955 | | 9/2006 |
| JP | 2007141948 A | * | 6/2007 |

\* cited by examiner

*Primary Examiner* — Alonzo Chambliss
(74) *Attorney, Agent, or Firm* — Oblon, Spivak, McClelland, Maier & Neustadt, L.L.P.

(57) ABSTRACT

A semiconductor device including: an insulating substrate including a ceramic substrate having first and second principal surfaces, a first metallic conductor fixed on the first principal surface, and a second metallic conductor fixed on the second principal surface; a semiconductor element disposed on the first metallic conductor on the first principal surface; and a base plate connected to the second metallic conductor on the second principal surface, and on which the insulating substrate being disposed. The second metallic conductor includes a joint area connected to the second principal surface, and a non-joint area formed around the joint area.

15 Claims, 2 Drawing Sheets

SEMICONDUCTOR DEVICE AND INSULATING SUBSTRATE UTILIZING A SECOND CONDUCTOR WITH A NON-JOINT AREA

BACKGROUND OF THE INVENTION

1. Field of the Invention

The present invention relates to a semiconductor device and an insulating substrate for the same, and more particularly, to a semiconductor device and an insulating substrate for the same preventing breakdown caused by thermal stress to increase the product's life.

2. Description of the Related Art

An insulating substrate of a ceramic substrate having sheet-like metallic conductors on the both sides respectively is used for a power semiconductor device. A power semiconductor element of IGBT for instance is fixed on the metallic conductor on the front surface of the ceramic substrate by a solder layer. The metallic conductor on the back surface of the ceramic substrate is fixed on a metallic base board by a solder layer. As the thermal expansion coefficients of the ceramic substrate and the metallic base board which are connected by the solder layer are different from each other, cracks are generated in the solder layer when the temperature of the power semiconductor device changes. Correspondingly, for instance, the area of the metallic conductor fixed on the back surface of the ceramic substrate is made broader than that of the back surface of the ceramic board, so that the concentration of the thermal stress near the corner portions of the ceramic substrate is specially prevented, and the generation of the cracks in the solder layer is prevented (JP, 2000-349209, A).

SUMMARY OF THE INVENTION

However, there is a problem that thermal stress is applied to the ceramic substrate when the temperature of the power semiconductor device changes, because the shapes or the like of the metallic conductors fixed on the front and back surfaces are different from each other.

An object of the present invention is to provide a semiconductor device preventing generation of cracks in a ceramic substrate included in an insulating substrate when the temperature of the semiconductor device changes, and the insulating substrate used for the same.

The present invention is directed to a semiconductor device including: an insulating substrate including a ceramic substrate having first and second principal surfaces, a first metallic conductor fixed on the first principal surface, and a second metallic conductor fixed on the second principal surface; a semiconductor element disposed on the first metallic conductor on the first principal surface; and a base plate connected to the second metallic conductor on the second principal surface, and on which the insulating substrate being disposed, wherein the second metallic conductor includes a joint area connected to the second principal surface, and a non-joint area formed around the joint area.

According to the present invention, generation of cracks in a ceramic substrate included in an insulating substrate is prevented even when the temperature of the semiconductor device changes. Hence, it is possible to provide a reliable and long-lived semiconductor device.

DETAILED DESCRIPTION OF THE PREFERRED EMBODIMENTS

Embodiment 1

Figure 1:
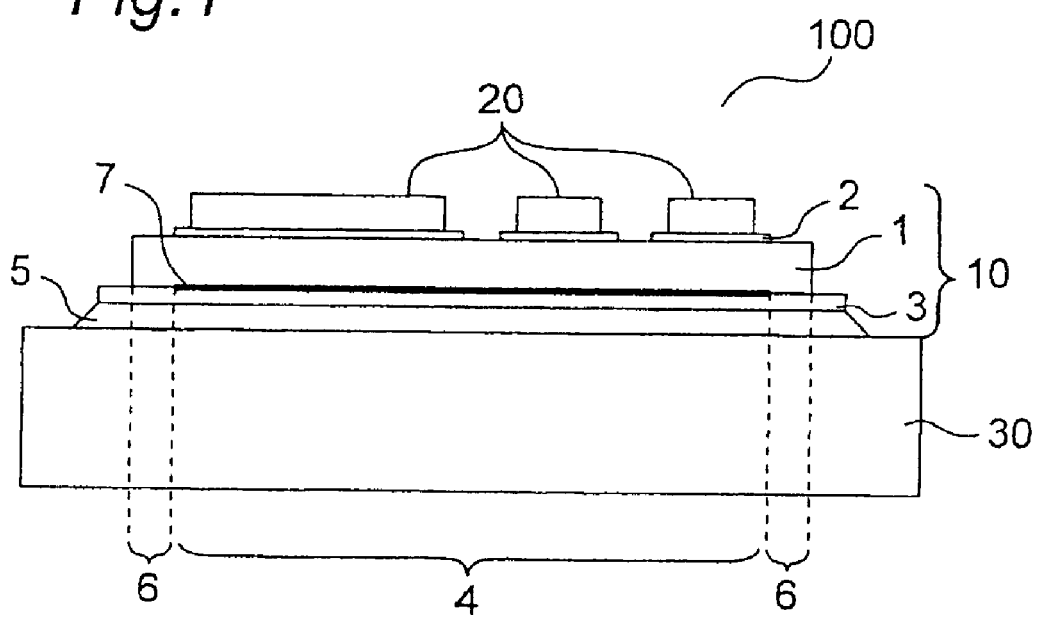
FIG. 1 shows a side view of the power semiconductor device according to the embodiment 1 of the present invention.

FIG. 1 is a side view of a power semiconductor device according to the embodiment 1 of the present invention, generally denoted at 100. The power semiconductor device 100 includes an insulating substrate 10. The insulating substrate 10 consists of a ceramic substrate 1 and metallic conductors 2 and 3 formed on the front (first principal) and rear (second principal) surfaces of the ceramic substrate 1 respectively. The ceramic substrate 1 is made of alumina for instance. The metallic conductors 2 and 3 are made of copper for instance, and are connected to the ceramic substrate 1 by using an active metal method for instance.

A semiconductor element 20 is fixed on the metallic conductor 2 on the front surface of the insulating substrate 10. A power FET, an IGBT (Insulated Gate Bipolar Transistor), or a FWD (Free Wheeling Diode) is used as a semiconductor element 20, for instance.

Furthermore, the metallic conductor 3 on the rear surface of the insulating substrate 10 and a metallic base plate 30 are joined by a solder layer 5, so that the insulating substrate 10 is fixed on the metallic base plate 30. The metallic base plate 30 is made of copper for instance, and is used in order to dissipate heat generated in the semiconductor element 20.

As shown in FIG. 1, between the ceramic substrate 1 and the metallic conductor 3, a non-joint area 6 in which the ceramic substrate 1 and the metallic conductor 3 are not joined is formed along the periphery of the ceramic substrate 1. In embodiments, as illustrated in FIG. 1, an active metal 7 is not included in the non-joint area 6.

Figure 2:
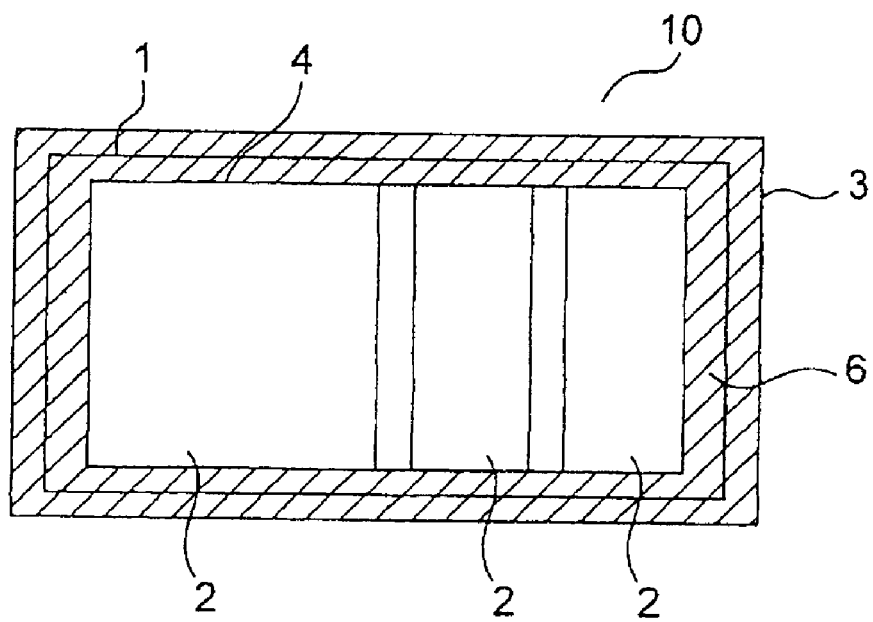
FIG. 2 shows a top view of the insulating substrate according to the embodiment 1 of the present invention.

FIG. 2 is a top view of the insulating substrate 10 seen from above (from the side of the semiconductor element 20). The ceramic substrate 1 is joined to the rear surface of the metallic conductor 2, and the metallic conductor 3 is joined to the rear surface of the ceramic substrate 1. The metallic conductor 3 is large enough that the peripheral part of the metallic conductor 3 spreads out of the edge of the ceramic substrate 1. It is noted that the insulating substrate 10 may be sold or distributed to the market by itself.

The shaded area shown in FIG. 2 is the non-joint area 6 between the ceramic substrate 1 and the metallic conductor 3. That is, the non-joint area 6 is located around the area which is opposed to the metallic conductors 2 formed on the front surface of the ceramic substrate 1 through the ceramic substrate 1. A joint area 4 is located at the areas opposed to the metallic conductors 2 and to the area sandwiched by two metallic conductors 2.

Figure 3:
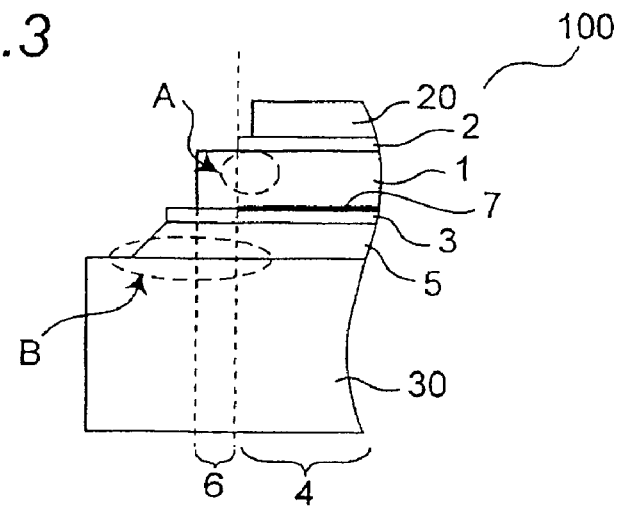
FIG. 3 shows a partly enlarged view of the power semiconductor device according to the embodiment 1 of the present invention.

FIG. 3 is a partly enlarged view of the power semiconductor device 100 shown in FIG. 1. The joint area 4 is located at the area opposed to the metallic conductor 2 through the ceramic substrate 1, and the non-joint area 6 is located around the joint area 4. In embodiments, as illustrated in FIG. 1, an active metal 7 is included in the joint area 4, where the active metal 7 joins the joint area 4 to the rear surface of ceramic substrate 1.

In the power semiconductor device 100 according to the embodiment 1, the peripheral part of the metallic conductor 3 is located out of the edge of the ceramic substrate 1. Hence, thermal stress generated in the area which is denoted at "B" in the solder layer 5 of FIG. 3 is released, so that cracks made in this area of the solder layer 5 can be prevented.

It is preferable to use a lead-free soldering, for instance, consisting primarily of tin and mixed with silver and copper as a material of the solder layer 5. As the lead-free soldering is generally weaker than a lead soldering under thermal stress, generation of cracks in the solder layer 5 is prevented by using the structure according to the embodiment 1.

Furthermore, in the power semiconductor device 100, the joint area 4 is located at the area opposed to the metallic conductor 2 through the ceramic substrate 1, and the non-joint area 6 is located around the joint area 4. Thereby thermal stress generated at the portion denoted at "A" in FIG. 3 is released and becomes smaller than that generated in a power semiconductor device without the non-joint area 6. Consequently, generation of the cracks at the portion denoted at "A" in the ceramic substrate 1 can be prevented.

As described above, in the power semiconductor device 100 according to the embodiment 1, generation of cracks in both of the ceramic substrate 1 included in the insulating substrate 10 and the soldering layer 5 joining the insulating substrate 10 with the metallic base plate 30 are prevented, and thereby the power semiconductor device 100 having high reliability and long product-life can be obtained.

Embodiment 2

Figure 4:
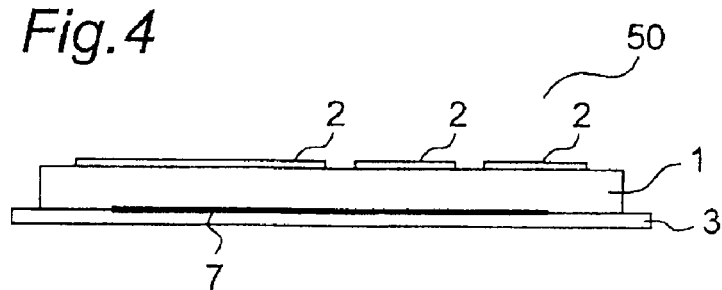
FIG. 4 shows a side view of the insulating substrate according to the embodiment 2 of the present invention.
Figure 5:
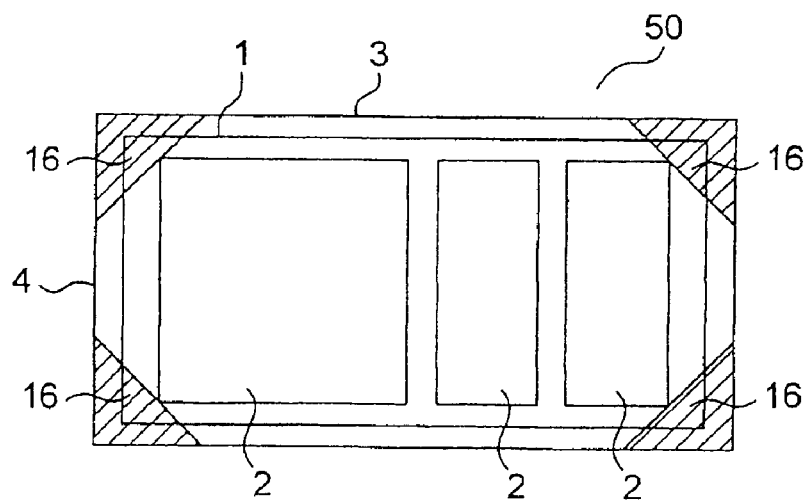
FIG. 5 shows a top view of the insulating substrate according to the embodiment 2 of the present invention.

FIG. 4 is a side view of the insulating substrate according to the embodiment 2 of the present invention, generally denoted at 50, and FIG. 5 is a top view of the insulating substrate 50. In FIGS. 4 and 5, the numerals which are identical with those of FIG. 1 denote identical and corresponding components. The insulating substrate 50 may be used instead of the insulating substrate 10 of the above-mentioned power semiconductor device 100.

In the insulating substrate 50, a non-joint area 16 having an approximately triangular shape is formed at each corner of the metallic conductor 3 respectively. The area other than the non-joint areas 16 is used as a joint area 4. Each of the four approximately triangular non-joint areas 16 is preferably formed so that one side (the longest side) of the triangle overlaps with the corner of the metallic conductor 2 through the ceramic substrate 1.

Thermal stress generated at the portion denoted at "A" in FIG. 3 increases particularly at the corner of the ceramic substrate 1. By forming the non-joint area 16 at each corner of the metallic conductor 3, the thermal stress is released particularly at the corners of the ceramic substrate 1, and thereby generation of cracks can be prevented.

As described above, by applying the insulating substrate 50 according to the embodiment 2 to the power semiconductor device 100, generation of the cracks in both of the ceramic substrate 1 included in the insulating substrate 50 and the soldering layer 5 joining the insulating substrate 50 with the metallic base plate 30 are prevented, and thereby the power semiconductor device 100 having high reliability and long product-life can be obtained.

It is noted that the first metallic conductor 2 can be made of metal which is different from and/or has different thickness from the second metallic conductor 3. This will make it possible to reduce the thermal stress generated in the insulating substrates 10 and 50.

What is claimed is:

1. A semiconductor device comprising:
    an insulating substrate comprising a ceramic substrate having first and second principal surfaces, a first metallic conductor fixed on the first principal surface, and a second metallic conductor fixed on the second principal surface by an active metal;
    a semiconductor element disposed on the first metallic conductor on the first principal surface; and
    a base plate connected to the second metallic conductor on the second principal surface, and on which the insulating substrate being disposed,
    wherein the second metallic conductor comprises a joint area joined by the active metal to the second principal surface, and a non-joint area formed around the joint area, and
    wherein, in the non-joint area, the second metallic conductor is contacted to the second principal surface but is not joined by the active metal to the second principal surface.

2. A semiconductor device according to claim 1, wherein the second metallic conductor comprises the joint area opposed to the first metallic conductor through the ceramic substrate, the non-joint area formed along the periphery of the second metallic conductor.

3. A semiconductor device according to claim 1, wherein the non-joint area is an approximately triangular area including the corner of the second metallic conductor.

4. A semiconductor device according to claim 3, wherein one side of the approximately triangular non-joint area opposes to the corner of the first metallic conductor through the ceramic substrate.

5. A semiconductor device according to claim 3, wherein the second metallic conductor is formed so that the peripheral part of the second metallic conductor spreads out of the edge of the ceramic substrate.

6. A semiconductor device according to claim 1, wherein the first and second metallic conductors are made of different metals from each other.

7. A semiconductor device according to claim 1, wherein the first and second metallic conductors are made of metals of which thickness are different from each other.

8. A semiconductor device according to claim 1, wherein the second metallic conductor and the base plate are connected by a lead-free soldering.

9. An insulating substrate disposing a semiconductor element, comprising:
    a ceramic substrate having first and second principal surfaces;
    a first metallic conductor fixed on the first principal surface and allowing the semiconductor element to be disposed thereon; and
    a second metallic conductor fixed on the second principal surface by an active metal and allowing to be connected to a base plate,
    wherein the second metallic conductor comprises a joint area joined by the active metal to the second principal surface and a non-joint area formed around the joint area; and
    wherein, in the non-joint area, the second metallic conductor is contacted to the second principal surface but is not joined by the active metal to the second principal surface.

10. An insulating substrate according to claim 9, wherein the second metallic conductor comprises the joint area opposed to the first metallic conductor through the ceramic substrate, and the non-joint area formed along the periphery of the second metallic conductor.

11. An insulating substrate according to claim 9, wherein the non-joint area is an approximately triangular area including the corner of the second metallic conductor.

12. An insulating substrate according to claim 11, wherein one side of the approximately triangular non-joint area opposes to the corner of the first metallic conductor through the ceramic substrate.

13. An insulating substrate according to claim 9, wherein the second metallic conductor is formed so that the peripheral part of the second metallic conductor spreads out of the edge of the ceramic substrate.

14. An insulating substrate according to claim 9, wherein the first and second metallic conductors are made of different metals from each other.

15. An insulating substrate according to claim 9, wherein the first and second metallic conductors are made of metals of which thickness are different from each other.

* * * * *